(12) United States Patent
Bhakta et al.

(10) Patent No.: US 6,335,235 B1
(45) Date of Patent: *Jan. 1, 2002

(54) SIMPLIFIED METHOD OF PATTERNING FIELD DIELECTRIC REGIONS IN A SEMICONDUCTOR DEVICE

(75) Inventors: Jayendra D. Bhakta, Sunnyvale; Carl P. Babcock, Campbell, both of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/376,055

(22) Filed: Aug. 17, 1999

(51) Int. Cl.[7] ........................................... H01L 21/8238

(52) U.S. Cl. ..................... 438/221; 438/218; 438/219; 438/221; 438/224; 438/225; 438/228; 257/367; 257/374

(58) Field of Search ................................. 257/367, 374; 438/218, 219, 221, 224, 225, 228

(56) References Cited

U.S. PATENT DOCUMENTS

| 5,966,616 | A | * | 10/1999 | Woerlee | 438/424 |
| 6,107,167 | A | * | 8/2000 | Bhakta | 438/483 |
| 6,121,133 | A | * | 9/2000 | Iyer et al. | 438/636 |

* cited by examiner

Primary Examiner—Matthew Smith
Assistant Examiner—Belur Keshavan

(57) ABSTRACT

Isolation regions are formed with greater accuracy and consistency by forming an oxide-silicon nitride stack and then depositing an amorphous silicon antireflective layer, on the silicon nitride layer before patterning. Embodiments also include depositing the silicon nitride layer and the amorphous silicon layer in the same tool.

13 Claims, 3 Drawing Sheets

US 6,335,235 B1

SIMPLIFIED METHOD OF PATTERNING FIELD DIELECTRIC REGIONS IN A SEMICONDUCTOR DEVICE

RELATED APPLICATIONS

This application contains subject matter similar to subject matter disclosed in copending U.S. patent application Ser. No. 09/376,059, filed on Aug. 17, 1999, and copending U.S. patent application Ser. No. 09/376,058, filed on Aug. 17, 1999, and copending U.S. patent application Ser. No. 09/376,056, filed on Aug. 17, 1999.

TECHNICAL FIELD

The present invention relates to a method of manufacturing a semiconductor device having accurate and uniform field dielectric regions. The present invention is applicable to manufacturing high speed integrated circuits having submicron design features and high conductivity reliable interconnect structures.

BACKGROUND ART

Current demands for high density and performance associated with ultra large scale integration require design rules of about 0.18 microns and under, increased transistor and circuit speeds and improved reliability. As device scaling plunges into the deep sub-micron ranges, it becomes increasingly difficult to maintain performance and reliability.

Devices built on the semiconductor substrate of a wafer must be isolated. Isolation is important in the manufacture of integrated circuits which contain a plethora of devices in a single chip because improper isolation of transistors causes current leakage which, in turn, causes increased power consumption leading to increased noise between devices.

In the manufacture of conventional complementary metal oxide semiconductor (CMOS) devices, isolation regions, called field dielectric regions, e.g., field oxide regions, are formed in a semiconductor substrate of silicon dioxide by local oxidation of silicon (LOCOS) or by shallow trench isolation (STI).

In the LOCOS method, an inert layer, such as a nitride layer is typically formed on a pad oxide layer on a semiconductor substrate. Thereafter, a patterned photoresist mask is formed on the nitride layer and the nitride layer-pad oxide is etched to expose areas in the substrate selected for LOCOS formation. The pad is removed, and localized regions of silicon oxide are then grown in the exposed areas and the nitride layer is removed. In the STI method, a barrier layer, such as an oxide is typically formed on a semiconductor substrate and an inert layer, such as a nitride, is formed on the barrier layer. A photoresist mask is formed on the nitride layer and the nitride, barrier oxide and substrate are etched to form shallow trenches in the semiconductor substrate. Photoresist is then removed, and the resulting shallow trenches are filled with a dielectric material.

Photolithography is conventionally employed to transform complex circuit diagrams into patterns which are defined on the wafer in a succession of exposure and processing steps to form a number of superimposed layers of insulator, conductor and semiconductor materials. Scaling devices to smaller geometries increases the density of bits/chip and also increases circuit speed. The minimum feature size, i.e., the minimum line-width or line-to-line separation that can be printed on the surface, controls the number of circuits that can be placed on the chip and directly impacts circuit speed. Accordingly, the evolution of integrated circuits is closely related to and limited by photolithographic capabilities.

An optical photolithographic tool includes an ultraviolet (UV) light source, a photomask and an optical system. A wafer is covered with a photosensitive layer, called a resist, because of its ability to resist etchants. The mask is illuminated with UV light and the mask pattern is imaged onto the resist by the optical system. Photoresists are organic compounds whose solubility in a developer changes as a result of exposure to light or x-rays. The exposed regions become either more soluble or less soluble in a developer solvent.

There are, however, significant problems attendant upon the use of conventional LOCOS or STI methodology to form field dielectric regions in a semiconductor substrate. For example, when a photoresist is coated on a highly reflective surface, such as silicon nitride which has an index of refraction of about 2.00, and exposed to monochromatic radiation, undesirable "swing effects" are produced as a result of interference between the reflected wave and the incoming radiation wave. In particular, swing effects are caused when the light waves propagate through a photoresist layer down to the silicon nitride layer, where they are reflected back up through the photoresist and through the silicon nitride to the sbstrate, when they are again reflected to the photoresist.

These swing effects cause the light intensity in the resist film to vary periodically as a function of resist thickness, thereby creating variations in the development rate along the edges of the resist and leading to uncontrolled line width variations. These reflections make it difficult to control critical dimensions (CDs) such as linewidth and spacing of the photoresist and have a corresponding negative impact on the CD control of the shallow isolation trenches.

There are further disadvantages attendant upon the use of conventional LOCOS and STI methodologies. For example, distortions in the photoresist are further created during passage of reflected light through the highly reflective silicon nitride layer which is typically used as a hardmask for STI etching. Specifically, normal fluctuations in the thickness of the silicon nitride layer cause a wide range of varying reflectivity characteristics across the silicon nitride layer, further adversely affecting the ability to maintain tight CD control of the photoresist pattern and the resulting shallow isolation trenches.

Highly reflective transparent substrates accentuate the swing effects, and thus one approach to addressing the problems associated with the high reflectivity of the silicon nitride layer has been to attempt to suppress such effects through the use of dyes and anti-reflective coatings below the photoresist layer. For example, an anti-reflective coating (ARC), such a s a polymer film, has been deposited directly on the silicon nitride layer. The ARC serves to eliminate reflection of most of the radiation that penetrates the photoresist thereby reducing the negative effects stemming from the underlying reflective materials during photoresist patterning. Unfortunately, use of an ARC adds significant drawbacks with respect to process complexity. To utilize an organic or inorganic ARC, the process of manufacturing the semiconductor chip must include a process step for depositing the ARC material, and also a step for prebaking the organic ARC or depositing a protective coating on the inorganic ARC before spinning the photoresist.

There exists a need for a cost effective, simplified processes enabling the formation of an ARC to prevent the negative effects stemming from the underlying reflective materials during photoresist patterning.

The present invention addresses and solves the problems attendant upon conventional multi-step, time-consuming and complicated processes for manufacturing semiconductor devices utilizing an ARC.

DISCLOSURE OF THE INVENTION

An advantage of the present invention is an efficient cost-effective method of manufacturing a semiconductor device with accurately formed field dielectric regions.

Additional advantages of the present invention will be set forth in the description which follows, and in part, will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, which method comprises:

forming an oxide layer on a semiconductor substrate;

forming a silicon nitride layer on the oxide layer in a chamber;

forming an amorphous ($\alpha$)-silicon anti-reflective coating on the silicon nitride layer in the chamber; and Embodiments of the present invention include forming the $\alpha$-silicon layer and the silicon nitride layer in the sane deposition chamber.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1A:
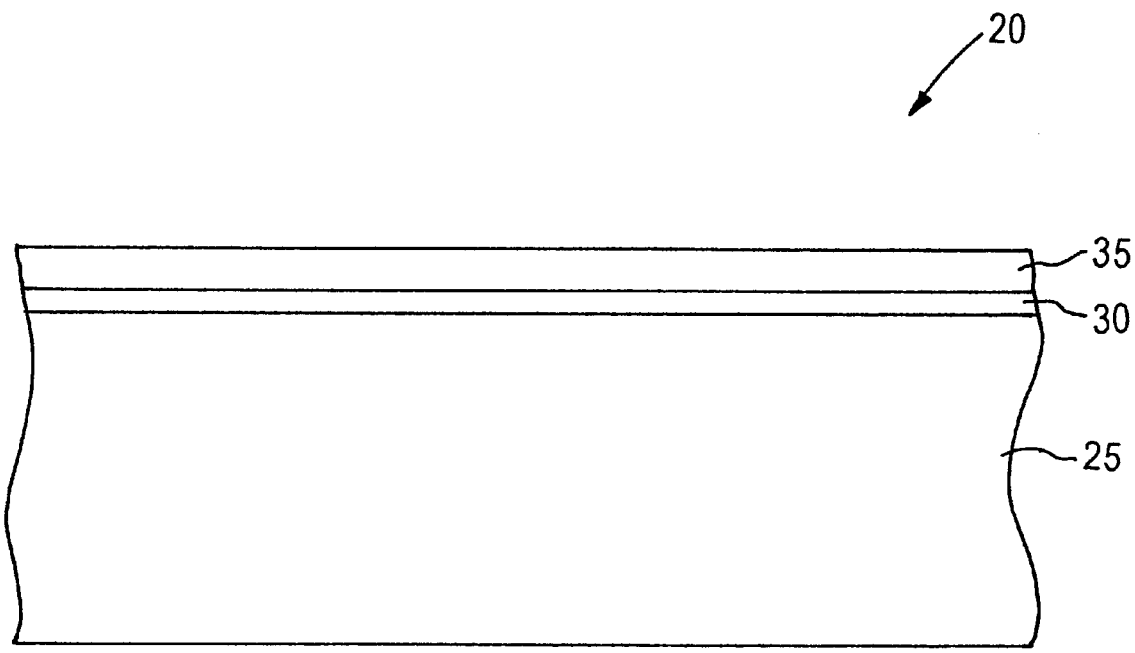
FIGS. 1A–1F schematically illustrate sequential phases of a method in accordance with an embodiment of the present invention.

The present invention addresses and solves problems stemming from conventional methodologies of forming field dielectric regions, e.g., shallow trench isolations. Such problems include costly and time-consuming steps limited by materials which require different deposition systems and apparatus.

The present invention constitutes an improvement over conventional practices in forming field dielectric regions wherein a photoresist is deposited on a highly reflective surface, such as silicon nitride. The present invention enables the formation of dielectric regions with accurately controlled critical dimensions. In accordance with embodiments of the present invention, the semiconductor device can be formed by: forming an oxide layer on a semiconductor substrate; forming a silicon nitride layer on the oxide layer in a chamber; forming $\alpha$-silicon anti-reflective coating on the silicon nitride layer in the chamber; and forming a photoresist mask on the $\alpha$-silicon coating. Embodiments of the present invention include forming the $\alpha$-silicon coating and the silicon nitride layer in the same deposition chamber.

Devices formed in accordance with embodiments of the present invention can be, but are not limited to, interconnects formed by damascene technology. Given the present disclosure and the objectives of the present invention, the conditions during which the silicon nitride layer and the $\alpha$-silicon antireflective coating are formed can be optimized in a particular situation. For example, the invention can be practiced by forming the silicon nitride layer by introducing a nitrogen containing gas, such as ammonia ($NH_3$) and dichlorosilane ($SiCl_2H_2$) in a chamber at a ratio of about 1:2 to about 1:10, such as about 1:6. Thereafter, the flow of $NH_3$ is shut down and $SiH_4$ is introduced and a anti-reflective coating of $\alpha$-silicon is formed on the silicon nitride layer in the same chamber. Given the stated objective, one having ordinary skill in the art can easily optimize the pressure, temperature and gas flow as well as other process parameters for a given situation. It has been found suitable to introduce the $SiCl_2H_2$ at about 100 SCCM, to introduce the $NH_3$ at about 600 SCCM, to maintain a temperature of about 700 to about 800° C., such as about 760° C. and to maintain a pressure of about 300 to about 400 m torr, such as about 325 m Torr, during deposition of the silicon nitride layer. It has further been found suitable to introduce the $SiH_4$ at about 50 SCCM, to maintain a temperature of about 500° C. to about 600° C., such as about 530° C., and to maintain a pressure of about 150 to about 250 m torr, such as about 200 m torr during deposition of the $\alpha$-silicon layer. Thus, an $\alpha$-silicon effective antireflective coating (ARC) is formed by an elegantly simplified, cost-effective technique of forming both the silicon nitride layer and the $\alpha$-silicon layer in the same chamber.

An embodiment of the present invention is schematically illustrated in FIGS. 1A–1F. Adverting to FIG. 1A, a wafer 20 comprising a semiconductor substrate 25, such as silicon, is provided. A barrier layer 30, comprising an oxide, e.g. silicon dioxide, is grown on the substrate, as by subjecting the wafer to an oxidizing ambient at elevated temperature. The silicon dioxide layer 30 protects the semiconductor substrate during the manufacturing process. Embodiments of the present invention comprise forming the oxide layer to a thickness of about 100 Å to about 200Å.

With continued reference to FIG. 1A, a hardmask 35, such as a silicon nitride layer, e.g., substantially stoichiometric $Si_3N_4$, is deposited on the silicon dioxide layer 30 by placing the oxidized substrate in a chamber. The silicon nitride layer 35 is formed by introducing a nitrogen containing gas, such as ammonia ($NH_3$) and $SiCl_2 H_2$ in a chamber at a ratio of about 1:6. Embodiments of the present invention comprise forming the silicon nitride layer to a thickness of about 1200 Å to about 2000 Å.

Figure 1B:
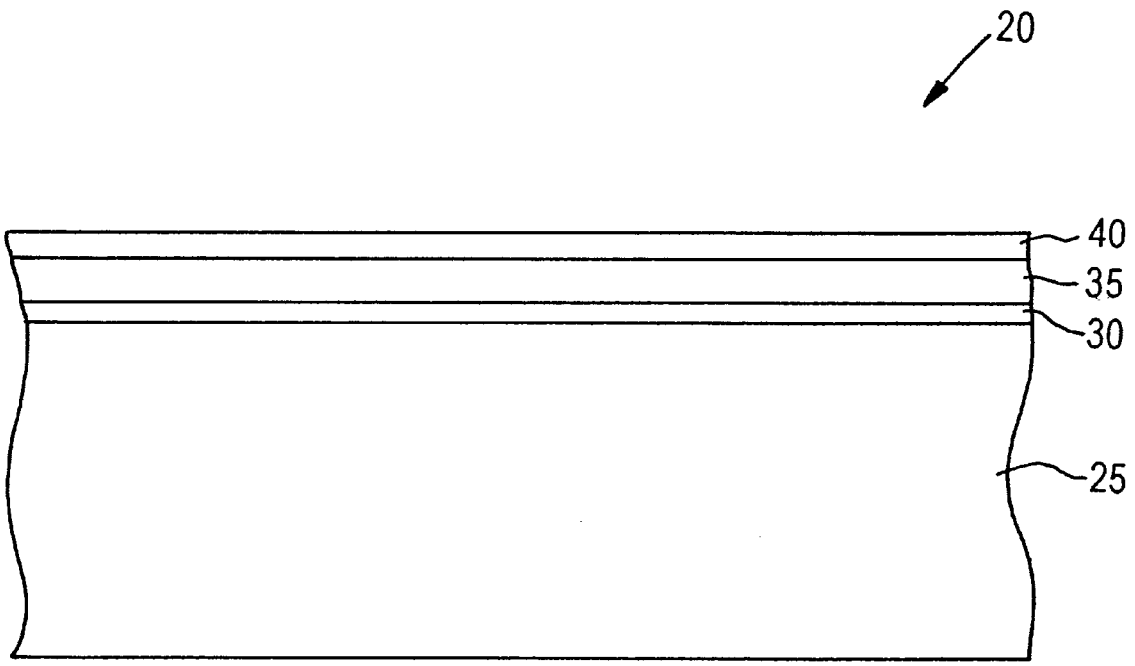

With reference to FIG. 1B, an $\alpha$-silicon anti-reflective coating 40 is formed on the silicon nitride layer 35, as by stopping the flow of $NH_3$ and introducing $SiH_4$ gas. The $\alpha$-silicon anti-reflective coating 40 can be formed to a thickness of about 100 Å to about 600 Å. The $\alpha$-silicon layer 40 has an extinction coefficient (k) greater than about 0.4, such as about 0.4 to about 0.6, thereby permitting tighter critical dimension control during patterning of the photoresist and tighter critical dimension control of the openings, such as shallow isolation trenches, subsequently formed in the substrate 25. The tighter critical dimension control is possible since the $\alpha$-silicon layer 40 absorbs a large percentage of the reflected light and thus reduces swing effects which otherwise lead to increased CD variation.

Figure 1C:
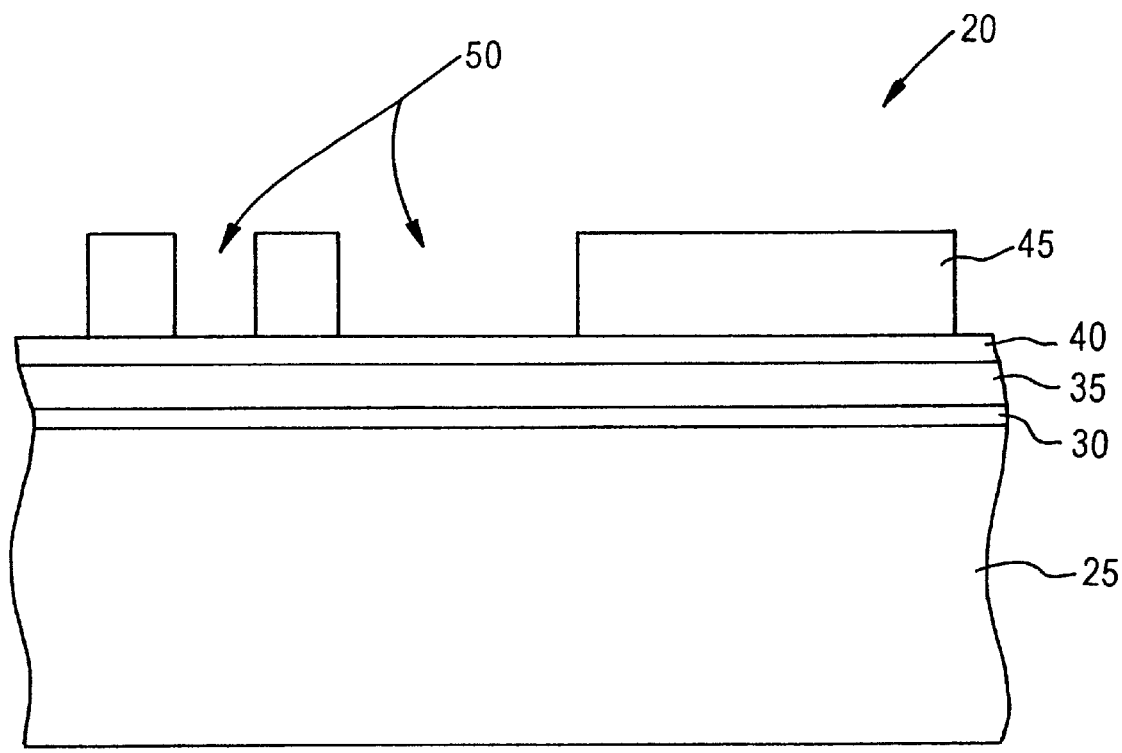

Referring to FIG. 1C, a photoresist mask 45 is formed on the $\alpha$-silicon layer 40 to complete a film stack used in forming the shallow trench isolation. Photoresist mask 45 can comprise any of a variety of conventional photoresist materials which are suitable to be patterned using photolithography. With continued reference to FIG. 1C, the photoresist mask 45 is patterned and holes 50 are formed in the photoresist mask 45 to provide an opening through which etching of the underlying $\alpha$-silicon layer 40, silicon nitride layer 35, silicon dioxide layer 30, and semiconductor substrate 25 may take place. If critical dimensions, such as a line width and spacing, of the hole 50 in the photoresist mask 45 are not closely controlled, distortions occurring in forming the hole affect the dimensions of the shallow isolation trenches ultimately formed in the substrate 25. As mentioned above, such distortions in patterning the photoresist mask 44 occur in conventional methodologies as a result of the high reflectivity of the silicon nitride layer 35 and the thickness variations in the silicon nitride layer and cause nonuniform photo-reflectivity. The α-silicon anti-reflective coating 40 of the present invention substantially absorbs light reflected back through the silicon nitride layer 35, thereby reducing incident light on the photoresist mask 45 and preventing fluctuations which would otherwise occur in the critical dimensions of the holes 50 in the photoresist mask 45.

Figure 1D:
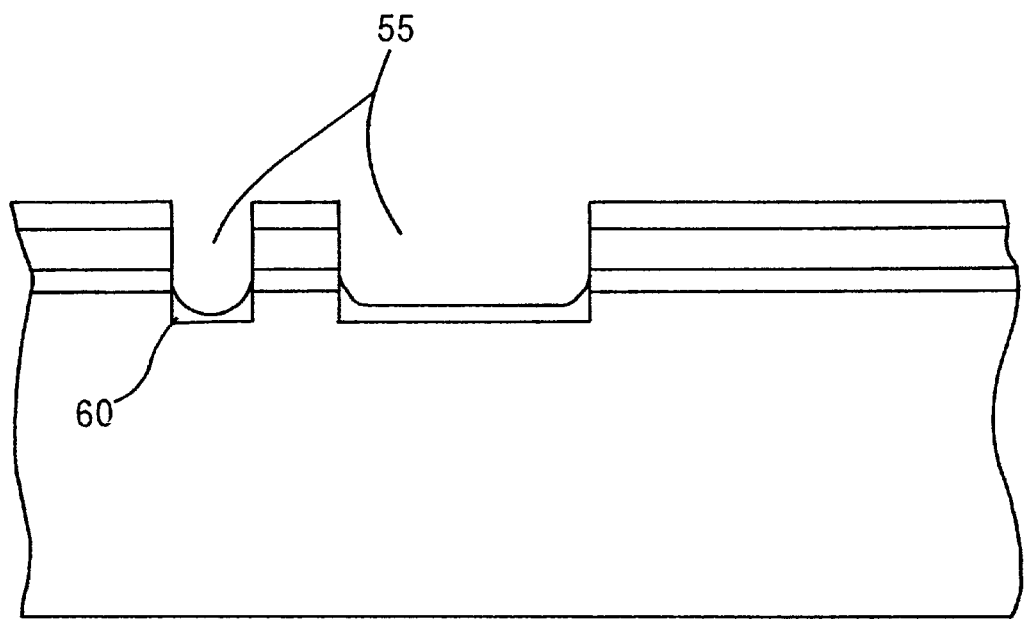

Adverting to FIG. 1D, a plurality of openings 55, such as shallow isolation trenches, are formed in the semiconductor substrate 25, such as by conventional plasma etching of the α-silicon layer 40, the silicon nitride layer 35, the silicon oxide layer 30 and the semiconductor substrate 25. The plasma etching may occur in a single step or consecutive plasma etching steps. Isolation trenches 55 can be formed in any appropriate shape. For example, isolation trenches 55, can be substantially trapezoidal in shape and have side walls which are angled approximately 70° with respect to a horizontal line (not shown). Embodiments of the present invention comprise forming the isolation trenches to a depth of about 2,000 Å to about 5,000 Å.

Figure 1E:
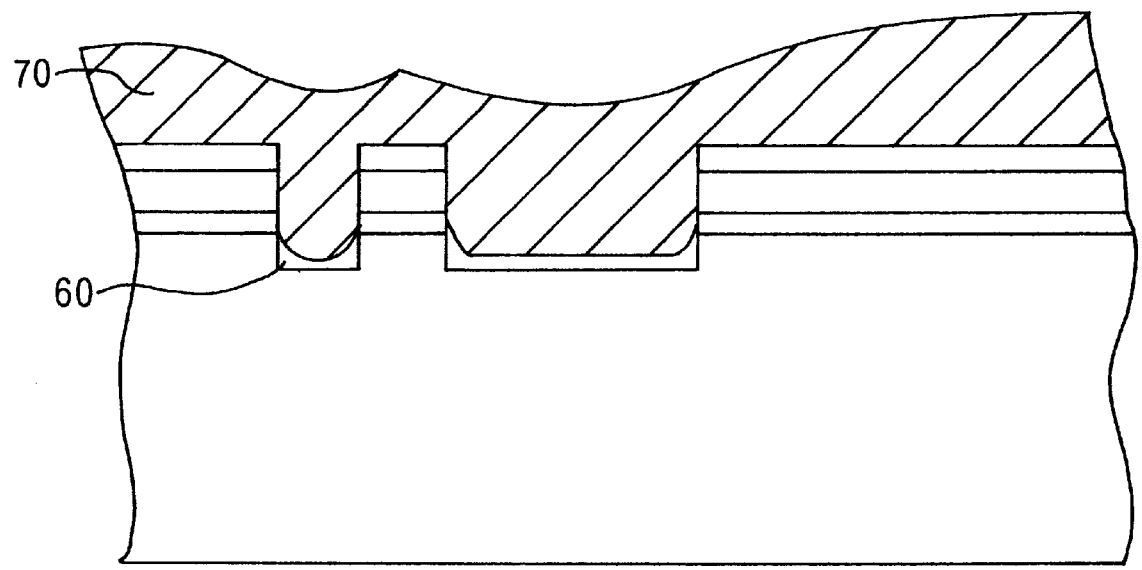

Referring to FIG. 1E, the photoresist mask is stripped from the wafer, utilizing conventional etching techniques. With continued reference to FIG. 1E, a liner oxide 60, such as a thermally grown silicon oxide, is grown in the isolation trenches. Thereafter, a dielectric material 70, such as silicon dioxide, is deposited on the liner oxide 60 and fills the isolation trench. The dielectric material which fills the isolation trenches electrically isolates adjacent components on the substrate.

Figure 1F:
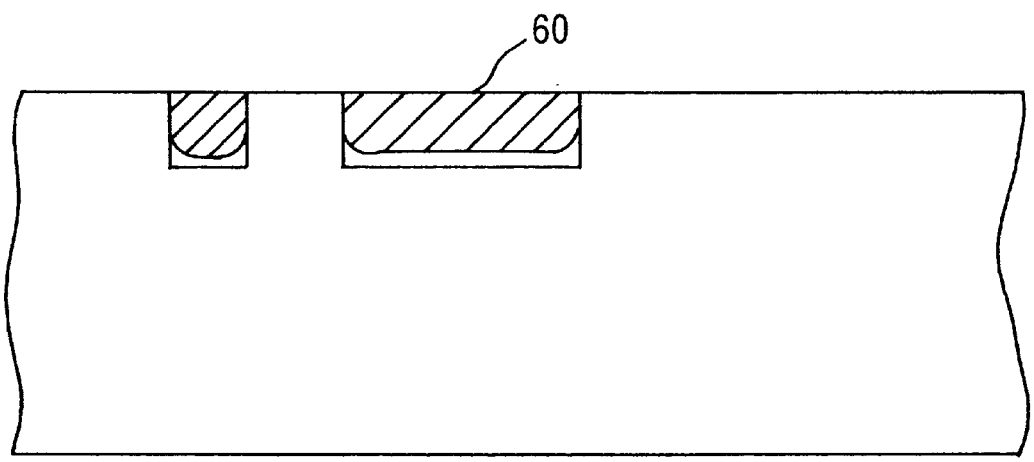

Referring to FIG. 1F, the dielectric material which fills the isolation trenches and lines the substrate is polished, as by chemical-mechanical polishing (CMP), such that the upper surface of the dielectric material filling the isolation trenches is substantially coplanar with the upper surface of the silicon nitride layer 35 (not shown). Thereafter, the silicon nitride layer 35 and underlying oxide layer 30 are stripped utilizing conventional techniques such that the upper surface of the dielectric material filling the trenches is substantially coplanar with the upper surface of the substrate. At this point, the formation of the isolation trenches in the substrate suitable for electrically isolating adjacent components from one another is completed, and the wafer continues to the next stage in the overall manufacturing process. Subsequent conventional processing steps, though not illustrated, typically include; forming a conductive gate, such as polysilicon, on the semiconductor substrate, with a gate oxide layer in between; forming dielectric spacers on sidewalls of the gate; and forming source/drain regions on either side of the gate by implantation of impurities.

In accordance with the present invention, metallization structures are formed in an elegantly simplified, efficient and cost-effective manner. Advantageously, the α-silicon antireflective coating prevents the formation of standing waves and the negative effects stemming therefrom during photoresist patterning. The a-silicon antireflective layer formed in accordance with the present invention is particularly advantageous in forming interconnection patterns, particularly in various types of semiconductor devices having sub-micron features and high aspect ratios.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, which method comprises:

forming an oxide layer on a semiconductor substrate;

forming a silicon nitride layer on the oxide layer in a chamber;

forming an amorphous (α)-silicon anti-reflective coating on the silicon nitride layer in the chamber; and forming a photoresist mask on the α-silicon anti-reflective coating.

2. The method according to claim 1, comprising:

depositing the silicon nitride layer and α-silicon anti-reflective coating in the same deposition chamber.

3. The method according to claim 2, comprising:

forming the α-silicon anti-reflective coating to a thickness of about 100 Å to about 600 Å.

4. The method according to claim 2, comprising:

introducing a nitrogen-containing gas and $SiCl_2H_2$ into a plasma chamber at a ratio nitrogen-containing gas to $SiCl_2H_2$ of about 1:2 to about 1:10 to form the silicon nitride layer; and stopping the flow of nitrogen-containing gas and introducing $SiH_4$ to form the α-silicon anti-reflective coating.

5. The method according to claim 1, wherein the silicon nitride is substantially stoichiometric $Si_3N_4$.

6. The method according to claim 1, wherein the oxide layer is silicon dioxide.

7. The method according to claim 6, comprising:

forming the silicon oxide layer to a thickness of about 100 Å to about 200 Å.

8. The method according to claim 1, comprising:

forming the silicon nitride layer to a thickness of about 1200 Å to about 2000 Å.

9. The method according to claim 1, wherein the α-silicon anti-reflective coating has an extinction coefficient (k) greater than about 0.4.

10. The method according to claim 9, wherein the α-silicon anti-reflective coating has a k of about 0.4 to about 0.6.

11. The method according to claim 1, further comprising:

patterning the photoresist mask to form a plurality of openings; and etching a plurality of corresponding openings in the semiconductor substrate through the oxide layer, silicon nitride layer and α-silicon anti-reflective coating.

12. The method according to claim 11, comprising:

etching the semiconductor substrate to form a plurality of openings having a width at the surface of the substrate of about 0.15 microns to about 0.3 microns.

13. The method according to claim 1, further comprising:

forming a plurality of openings in the photoresist mask, the α-silicon anti-reflective coating, the silicon nitride layer, the oxide layer and the semiconductor substrate; and removing the photoresist mask, and lining the plurality of openings in the substrate with an oxide.

* * * * *